(12) United States Patent
Naruse

(10) Patent No.: US 7,501,746 B2
(45) Date of Patent: Mar. 10, 2009

(54) PIEZOELECTRIC OSCILLATOR

(75) Inventor: Hideto Naruse, Ebina (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 11/785,210

(22) Filed: Apr. 16, 2007

(65) Prior Publication Data

US 2007/0247030 A1 Oct. 25, 2007

(30) Foreign Application Priority Data

Apr. 24, 2006 (JP) .............................. 2006-119012

(51) Int. Cl.
*H01L 41/047* (2006.01)
(52) U.S. Cl. ..................... 310/365; 310/340; 310/344
(58) Field of Classification Search ................ 310/340, 310/344, 348, 365
See application file for complete search history.

(56) References Cited

U.S. PATENT DOCUMENTS

| | | | | |
|---|---|---|---|---|
| 6,924,429 B2 * | 8/2005 | Kasai et al. | ................. | 174/565 |
| 7,123,107 B2 * | 10/2006 | Koyama et al. | ................ | 331/68 |
| 7,157,836 B2 * | 1/2007 | Kinoshita | .................... | 310/348 |
| 7,218,036 B2 * | 5/2007 | Shimodaira et al. | ......... | 310/340 |

FOREIGN PATENT DOCUMENTS

| | | |
|---|---|---|
| JP | A-2005-244641 | 9/2005 |
| JP | A 2005-268257 | 9/2005 |

\* cited by examiner

*Primary Examiner*—Thomas M Dougherty
(74) *Attorney, Agent, or Firm*—Oliff & Berridge, PLC

(57) ABSTRACT

A piezoelectric oscillator includes: a package including a first recessed portion formed on a first surface, a second recessed portion formed on a second surface with at least a part of a side surface being open, and a conductor wired from at least one of an inside surface of the first recessed portion and an inside surface of the second recessed portion to an outside surface; a piezoelectric element accommodated in the first recessed portion; a lid being in contact with the first surface and air-tightly sealing the first recessed portion; a circuit element accommodated in the second recessed portion and connected with the conductor; a resin portion formed in the second recessed portion to cover the circuit element; and an electrical check terminal connected with the conductor of the package.

6 Claims, 4 Drawing Sheets

PIEZOELECTRIC OSCILLATOR

BACKGROUND

1. Technical Field

The present invention relates to a piezoelectric oscillator that is of the surface-mount type used in communication equipment and an electronic apparatus.

2. Related Art

Commonly, a piezoelectric oscillator such as a crystal oscillator provided with an electrical check terminal on a side surface of a package formed with a ceramic has been known. This electrical check terminal is a terminal connected with a crystal resonator element or an IC chip including an oscillation circuit and a memory circuit, and used for measuring oscillation frequency of the crystal resonator element, or writing temperature compensation data into the IC chip.

In recent years, downsizing of apparatuses has been rapidly progressed due to demand of improving portability of electronic apparatuses and communication equipment. Therefore, a piezoelectric oscillator as typified by a crystal oscillator used for those apparatuses is required to be reduced in size and height.

Along with the reduction in size and height of a crystal oscillator, a space to form an electrical check terminal on a package becomes limited. Therefore, a crystal oscillator having a structure to form an electrical check terminal on a bottom surface of the package is suggested as disclosed in JP-A-2005-268257 (FIGS. 2 and 3).

However, as a result of the reduction in size and height of a piezoelectric oscillator, a circuit element such as an IC chip accounts for a large portion of a package considering the size of the package. Therefore, an area to form an electrical check terminal on the bottom surface of the package becomes small. Further, when the size of an IC chip is larger than the package, an electrical check terminal cannot be formed on the bottom of the package.

SUMMARY

An advantage of the invention is to provide a piezoelectric oscillator having an electrical check terminal and reduced in size and height.

A piezoelectric oscillator according to an aspect of the invention includes: a package including a first recessed portion formed on a first surface, a second recessed portion formed on a second surface with at least a part of a side surface being open, and a conductor wired from at least one of an inside surface of the first recessed portion and an inside surface of the second recessed portion to an outside surface; a piezoelectric element accommodated in the first recessed portion; a lid being in contact with the first surface and air-tightly sealing the first recessed portion; a circuit element accommodated in the second recessed portion and connected with the conductor; a resin portion formed in the second recessed portion to cover the circuit element; and an electrical check terminal connected with the conductor of the package.

The piezoelectric oscillator with this structure includes the electrical check terminal formed on the resin portion of the package. In this way, if the piezoelectric oscillator is reduced in size and height, and the circuit element such as an IC chip to be accommodated in the second recessed portion needs to account for a large portion of the piezoelectric oscillator in comparison, the electrical check terminal of the piezoelectric oscillator can be formed on the exposed resin portion. As above, according to the aspect of the invention, a piezoelectric oscillator including an electrical check terminal and reduced in size and height can be provided.

Further, in the piezoelectric oscillator according to the aspect of the invention, the electrical check terminal is preferably formed on a side surface of the resin portion in the second recessed portion.

In this structure, the electrical check terminal is formed on the side surface of the resin portion exposed. Therefore, a contact portion such as a probe can be contacted with the electrical check terminal from the side of the piezoelectric oscillator, thereby enabling the piezoelectric oscillator to be electrically checked.

Further, in the piezoelectric oscillator according to the aspect of the invention, the electrical check terminal is preferably formed on a bottom surface of the resin portion in the second recessed portion.

With this structure, the electrical check terminal is formed on the bottom surface of the resin portion exposed. Therefore, a contact portion such as a probe can be contacted with the electrical check terminal from the bottom surface of the piezoelectric oscillator, thereby enabling the piezoelectric oscillator to be electrically checked.

In the piezoelectric oscillator according to the aspect of the invention, the electrical check terminal is preferably connected with the piezoelectric element and used for measuring a characteristic of the piezoelectric element.

With this structure, the characteristic of the piezoelectric element is measured by using the electrical check terminal so as to perform a characteristic inspection on the piezoelectric element.

In the piezoelectric oscillator according to the aspect of the invention, the electrical check terminal is preferably connected with the circuit element and used for measuring a characteristic of the circuit element.

With this structure, the characteristic of the circuit element such as an IC chip is measured by using the electrical check terminal so as to perform a characteristic inspection on the circuit element.

In the piezoelectric oscillator according to the aspect of the invention, the electrical check terminal is preferably connected with the circuit element and used for writing data for circuit adjustment to the circuit element.

With this structure, the data for circuit adjustment such as temperature compensation data can be written to the circuit element such as an IC chip by using the electrical check terminal, thereby providing a piezoelectric oscillator having a temperature compensation function.

BRIEF DESCRIPTION OF THE DRAWINGS

The invention will be described with reference to the accompanying drawings, wherein like numbers reference like elements.

FIG. 1A is a schematic plan view, while FIG. 1B is a schematic side view and FIG. 1C is a schematic bottom view.

FIG. 3A is a schematic plan view, while FIG. 3B is a schematic side view and FIG. 3C is a schematic bottom view.

FIG. 4A is a schematic plan view, while FIG. 4B is a schematic side view and FIG. 4C is a schematic bottom view.

DESCRIPTION OF EXEMPLARY EMBODIMENTS

Embodiments of the invention will be described with reference to the accompanying drawings. In the embodiments, a crystal oscillator will be described as an example of a piezoelectric oscillator.

First Embodiment

Figure 1A:
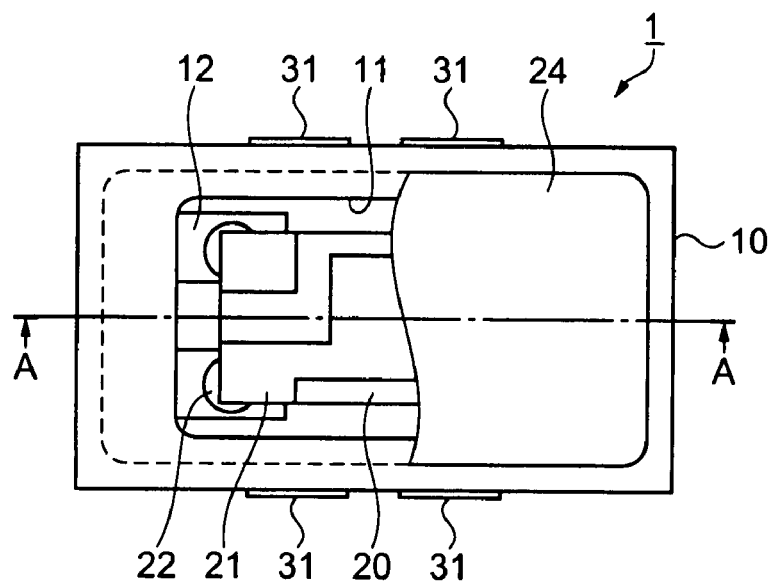
FIGS. 1A through 1C show a structure of a crystal oscillator according to a first embodiment.
Figure 1B:
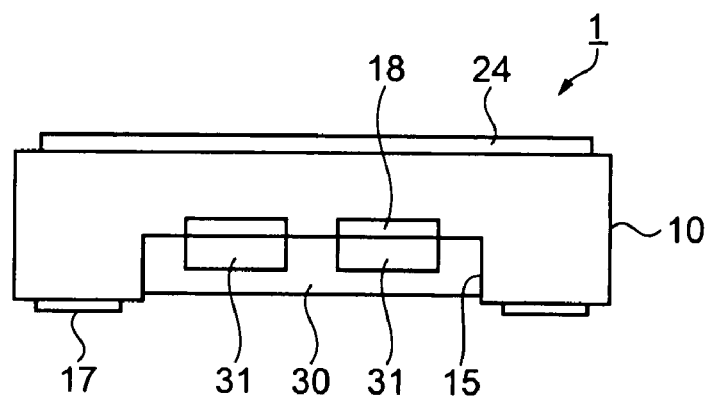
Figure 1C:
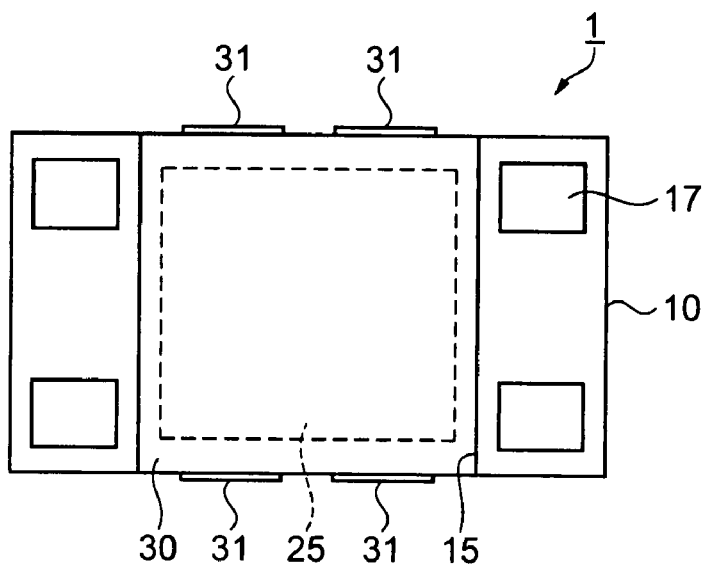
Figure 2:
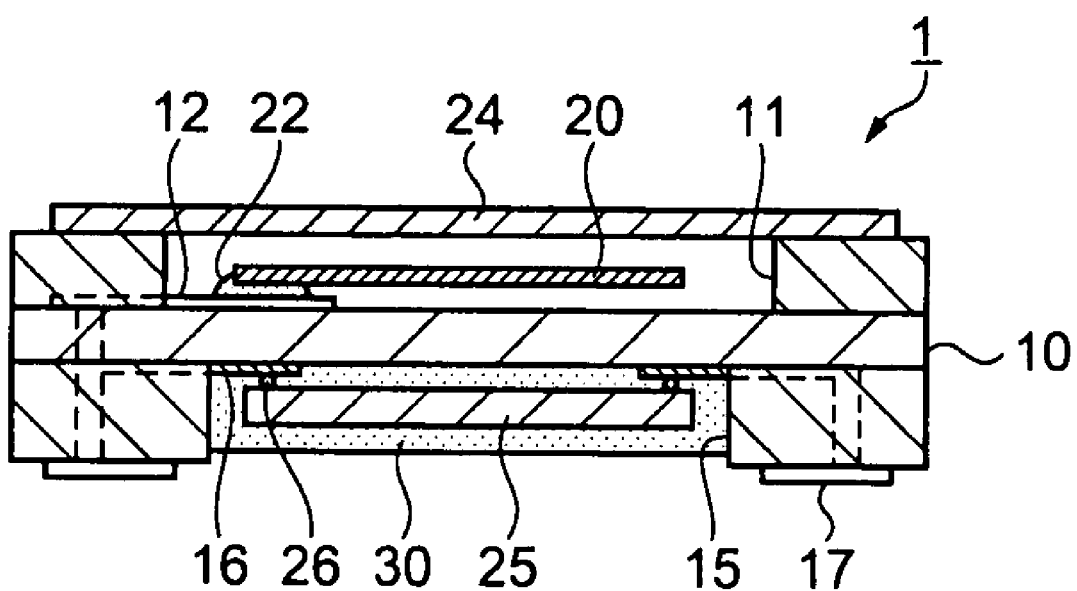
FIG. 2 is a sectional view taken along the line A to A in FIG. 1A showing the crystal oscillator according to the first embodiment.

FIGS. 1A through 1C show a structure of a crystal oscillator according to a first embodiment. FIG. 1A is a schematic plan view, while FIG. 1B is a schematic side view and FIG. 1C is a schematic bottom view. FIG. 2 is a sectional view taken along the line A to A in FIG. 1A.

In FIGS. 1A through 2, a crystal oscillator 1 includes a package 10, a crystal resonator element 20 as a piezoelectric element, an IC chip 25 as a circuit element, a lid 24, and a resin portion 30 covering the IC chip 25.

The package 10 formed with a material such as ceramic has a first recess 11 on a first surface. On a bottom surface of the first recess 11, the crystal resonator element 20 is bonded with a conductive adhesive 22 such as an Ag paste. On the crystal resonator element 20, an excitation electrode 21 is formed and electrically connected with a connection pad 12 that is a conductor formed on the bottom surface of the first recess 11 via the conductive adhesive 22. Further, on a top surface of the first recess 11, the lid 24 made of metal or the like is arranged and air-tightly seals the first recess 11.

Then, on a second surface of the package 10, a second recess 15 having the IC chip 25 arranged therein is formed. On the IC chip 25, a bump 26 made of Au or the like is formed and mounted face-down on a connection pad 16 that is a conductor formed on a bottom surface of the second recess 15. The IC chip 25 is provided with an oscillation circuit that excites the crystal resonator element 20, and in some cases, also includes a temperature compensation circuit and a memory circuit, for example.

Further, as shown in FIG. 1B and 1C, the second recess 15 is formed in a shape in which two sides facing each other are open so as to allow the IC chip 25 that is relatively large considering the size of the package 10 to be mounted. On the two sides of the package 10 where the second recess 15 are open, a terminal connector 18 to connect to wiring formed in the package 10 is formed.

Further, the second recess 15 is filled with a resin material such as epoxy resin to cover the IC chip 25, forming the resin portion 30. On the resin portion 30 exposed from the open sides of the second recess 15, an electrical check terminal 31 is formed and connected to the terminal connector 18 on the package 10. The electrical check terminal 31 on the resin portion 30 is formed by printing a conductive paste or applying conductive ink with an inkjet method.

Further, on a bottom surface of the package 10, an external connection terminal 17 is formed to make connection with an external circuit substrate or the like.

As described above, in the crystal oscillator 1 according to this embodiment, the electrical check terminal 31 is formed on the resin portion 30 exposed from the sides of the second recess 15 in the package 10. According to this structure, when the crystal oscillator 1 is reduced in size and height, and the IC chip 25 to be accommodated in the second recess 15 needs to account for a large portion of the crystal oscillator 1 considering the size of crystal oscillator 1, the electrical check terminal 31 can be formed on a side surface of the crystal oscillator 1 with the structure in which the sides of the second recess 15 in the package are open.

In addition, if the electrical check terminal 31 is connected to the crystal resonator element 20, characteristics of the crystal resonator element 20 can be measured by using the electrical check terminal 31, thereby enabling to perform a characteristic inspection on the crystal resonator element 20.

Further, if the electrical check terminal 31 is connected to the IC chip 25, characteristics of the IC chip 25 can be measured by using the electrical check terminal 31, thereby enabling to perform a characteristic inspection on the IC chip 25. Furthermore, when the IC chip 25 including a control circuit, a temperature compensation circuit, and a memory circuit is used, data for circuit adjustment such as inputting a control signal to a control circuit of the IC chip 25 or writing temperature compensation data in a memory circuit can be input to the IC chip 25. As a result, the crystal oscillator 1 having a temperature compensation function is provided.

As above, in this embodiment, the crystal oscillator 1 reduced in size and height and including the electrical check terminal 31 on the side surface thereof can be provided.

MODIFICATION EXAMPLE

A modification example of the first embodiment above will be explained next.

Figure 3A:
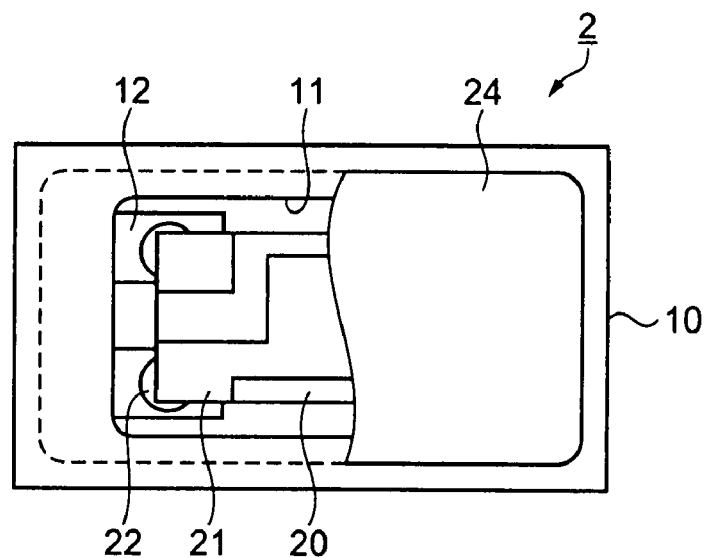
FIGS. 3A through 3C show a structure of a crystal oscillator according to a modification of the first embodiment.
Figure 3B:
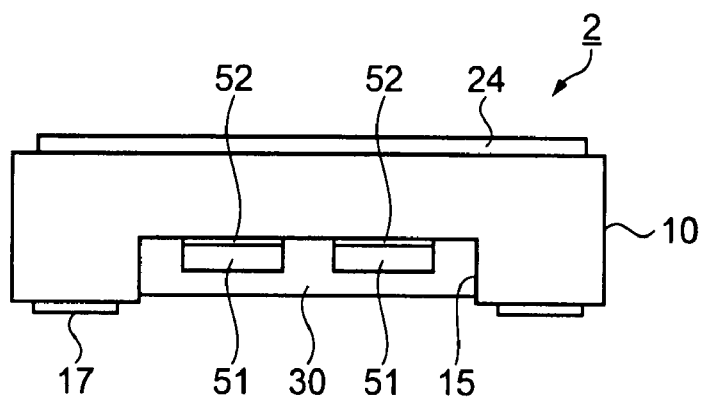
Figure 3C:
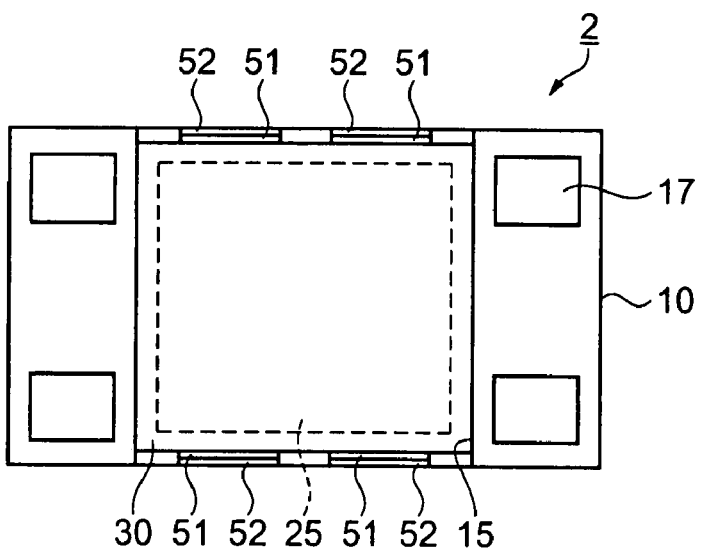

FIGS. 3A through 3C show a structure of a crystal oscillator according to the modification example of the first embodiment. FIG. 3A is a schematic plan view, while FIG. 3B is a schematic side view and FIG. 3C is a schematic bottom view.

The modification example has a characteristic in connection between a terminal connector of a package and an electrical check terminal formed on a resin portion. As for the same structure as that of the first embodiment, the same numerals are given and the description shall be omitted.

In FIGS. 3A through 3C, a crystal oscillator 2 has the crystal resonator element 20 accommodated in the first recess 11 in the package 10, and the first recess 11 is sealed air-tightly with the lid 24. Further, the IC chip 25 is accommodated in the second recess 15. The second recess 15 is filled with a resin material to cover the IC chip 25, forming the resin portion 30. The resin portion 30 is formed inward from the open sides facing each other of the second recess 15 in the package 10. Then, on the resin portion 30 exposed from the open sides of the second recess 15, an electrical check terminal 51 is formed and connected to a terminal connector 52 formed on a bottom surface of the second recess 15. The electrical check terminal 51 on the resin portion 30 is formed by printing a conductive paste or applying conductive ink with an inkjet method.

Further, on the bottom surface of the package 10, the external connection terminal 17 is formed to make a connection with an external circuit substrate or the like.

As described above, the electrical check terminal 51 formed on the resin portion 30 can be formed inward from the periphery of the package 10, providing the piezoelectric oscillator 2 having the electrical check terminal 51 and reduced in size and height with the same advantageous effects as those of the first embodiment.

Second Embodiment

Next, a crystal oscillator according to a second embodiment will be described.

Figure 4A:
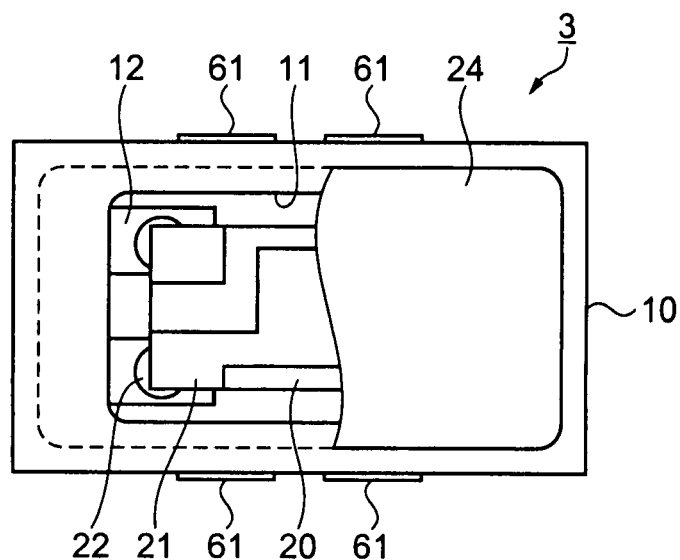
FIGS. 4A through 4C show a structure of a crystal oscillator according to a second embodiment.
Figure 4B:
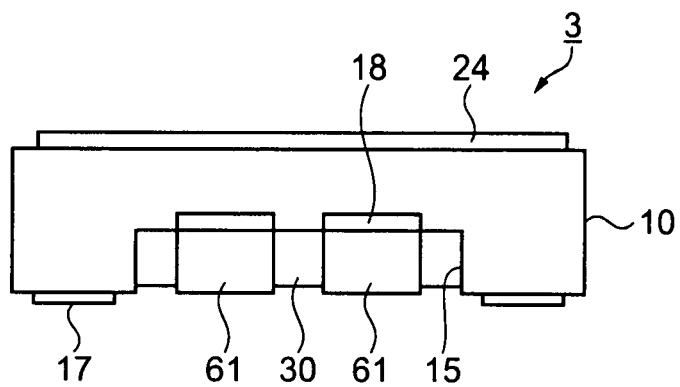
Figure 4C:
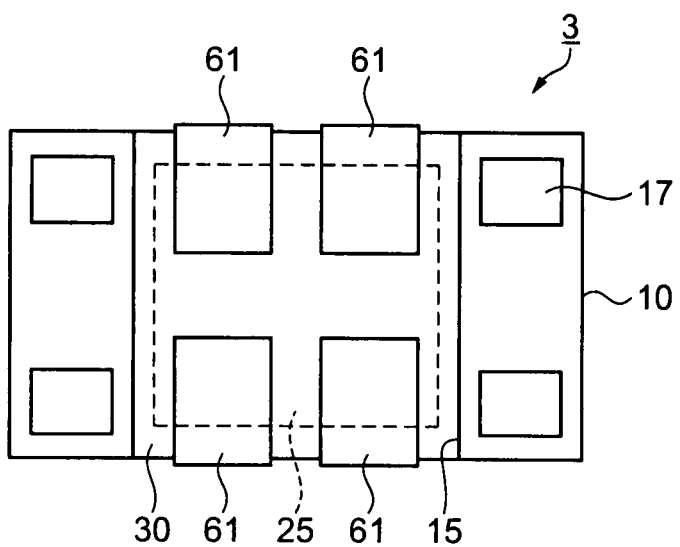

FIGS. 4A through 4C show a structure of a crystal oscillator according to the second embodiment. FIG. 4A is a schematic plan view, while FIG. 4B is a schematic side view and FIG. 4C is a schematic bottom view.

The second embodiment has a characteristic in a structure in which an electrical check terminal is extended from a side surface to a bottom surface of a resin portion. As for the same structure as that of the first embodiment, the same numerals are given and the description shall be omitted.

In FIGS. 4A through 4C, a crystal oscillator 3 has the crystal resonator element 20 accommodated in the first recess 11 in the package 10, and the first recess 11 is sealed air-tightly with the lid 24. Further, the IC chip 25 is accommodated in the second recess 15. The second recess 15 is filled with a resin material to cover the IC chip 25, forming the resin portion 30. Then, an electrical check terminal 61 is formed to extend from the side surface to the bottom surface of the resin portion 30 in the second recess 15. The electrical check terminal 61 is connected with the terminal connector 18 formed on a side surface of the package 10 so as to be connected with wiring formed by a conductor in the package 10. The electrical check terminal 61 on the resin portion 30 is formed by printing a conductive paste or applying conductive ink with an inkjet method.

Further, on a bottom surface of the package 10, the external connection terminal 17 is formed to make a connection with an external circuit substrate or the like.

As described above, the crystal oscillator 3 according to the second embodiment has the electrical check terminal 61 formed to extend from the side surface to the bottom surface of the resin portion 30 filled in the second recess 15. With this structure, even when the crystal oscillator 3 is reduced in size and height, and then an electrical check terminal cannot be formed on the side surface or the bottom surface of the package 10 as in a common way, it is possible to form the electrical check terminal on the bottom surface of the resin portion 30.

Further, if the electrical check terminal 61 is connected to the crystal resonator element 20, characteristics of the crystal resonator element 20 can be measured by using the electrical check terminal 61, thereby enabling to perform a characteristic inspection on the crystal resonator element 20.

Further, if the electrical check terminal 61 is connected to the IC chip 25, characteristics of the IC chip 25 can be measured by using the electrical check terminal 61, thereby enabling to perform a characteristic inspection on the IC chip 25. Furthermore, when the IC chip 25 including a temperature compensation circuit and a memory circuit is used, temperature compensation data can be written in the memory circuit using the electrical check terminal 61. As a result, the crystal oscillator 3 having a temperature compensation function is provided.

As above, in this second embodiment, the crystal oscillator 3 reduced in size and height, and including the electrical check terminal 61 on the side surface thereof can be provided.

In this invention, the electrical check terminal is formed on the resin portion, improving contact of a contact portion such as a probe comparing to an electrical check terminal formed on a package made of ceramic because the resin portion has elasticity.

Further, in the embodiments, the crystal oscillators using a crystal resonator-element as a piezoelectric element is described as an example. However, instead of a crystal resonator element, a piezoelectric oscillator using a piezoelectric resonator element made of a piezoelectric material such as lithium tantalate ($LiTaO_3$) or lithium niobate ($LiNbO_5$) can be also adopted.

What is claimed is:

1. A piezoelectric oscillator, comprising:
   a package including:
      a first recessed portion formed on a first surface;
      a second recessed portion formed on a second surface with at least a part of a side surface being open, and
      a conductor wired from at least one of an inside surface of the first recessed portion and an inside surface of the second recessed portion to an outside surface;
   a piezoelectric element accommodated in the first recessed portion;
   a lid being in contact with the first surface and air-tightly sealing the first recessed portion;
   a circuit element accommodated in the second recessed portion and connected with the conductor;
   a resin portion formed in the second recessed portion to cover the circuit element; and
   an electrical check terminal connected with the conductor of the package,
   wherein the electrical check terminal is formed on a surface of the resin portion with a conductive paste or conductive ink.

2. The piezoelectric oscillator according to claim 1, wherein the electrical check terminal is formed on a side surface of the resin portion in the second recessed portion.

3. The piezoelectric oscillator according to claim 1, wherein the electrical check terminal is formed on a bottom surface of the resin portion in the second recessed portion.

4. The piezoelectric oscillator according to claim 1, wherein the electrical check terminal is connected with the piezoelectric element and used for measuring a characteristic of the piezoelectric element.

5. The piezoelectric oscillator according to claim 1, wherein the electrical check terminal is connected with the circuit element and used for measuring a characteristic of the circuit element.

6. The piezo electric oscillator according to claim 1, wherein the electrical check terminal is connected with the circuit element and used for writing data for circuit adjustment to the circuit element.

* * * * *